(12) United States Patent
Kimura

(10) Patent No.: US 8,892,971 B2
(45) Date of Patent: Nov. 18, 2014

(54) OUTPUT CONTROL SCAN FLIP-FLOP, SEMICONDUCTOR INTEGRATED CIRCUIT INCLUDING THE SAME, AND DESIGN METHOD FOR SEMICONDUCTOR INTEGRATED CIRCUIT

(75) Inventor: Hayato Kimura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 164 days.

(21) Appl. No.: 13/568,943

(22) Filed: Aug. 7, 2012

(65) Prior Publication Data

US 2013/0055040 A1    Feb. 28, 2013

(30) Foreign Application Priority Data

Aug. 30, 2011  (JP) ................................. 2011-186917

(51) Int. Cl.
*G01R 31/28*      (2006.01)
*G01R 31/3185*    (2006.01)

(52) U.S. Cl.
CPC .............................. *G01R 31/318541* (2013.01)
USPC .......................................... 714/726; 714/731

(58) Field of Classification Search
CPC ...................... G01R 1/2853; G01R 31/318541;
G01R 31/318577; G01R 13/318594
USPC ........................... 714/726–727, E11.155, 731
See application file for complete search history.

(56) References Cited

U.S. PATENT DOCUMENTS 6,877,121 B1 *   4/2005  Srinivasaiah et al. .......... 714/727
2013/0111286 A1 *   5/2013  Tekumalla ..................... 714/726

FOREIGN PATENT DOCUMENTS

JP          2009-175154 A      8/2009

* cited by examiner

*Primary Examiner* — Guy Lamarre
(74) *Attorney, Agent, or Firm* — Sughrue Mion, PLLC

(57) ABSTRACT

An output control scan flip-flop according to the present invention includes a first scan flip-flop that captures first data in a first mode and second data in a second mode in synchronization with a clock signal to output the data that is captured, a second scan flip-flop that captures the data output from the first scan flip-flop in the second mode in synchronization with a clock signal to output the data that is captured, and a gating circuit that generates the data output from the first scan flip-flop in the first mode as output data, and generates output data having a change rate of a logic value lower than a change rate of a logic value of the data output from the first scan flip-flop based on the data output from each of the first scan flip-flop and the second scan flip-flop in the second mode.

15 Claims, 10 Drawing Sheets

| n-TH TIME | | (n+1)-TH TIME | | FLIP |
|---|---|---|---|---|
| Q OF 103 | a OF 101 | Q OF 103 | a OF 101 | |
| 0 | 0 | 0 | 0 | ○ (0->0) |
| 0 | 0 | 1 | 1 | × (0->1) |
| 1 | 1 | 0 | 0 | × (1->0) |
| 1 | 1 | 1 | 1 | ○ (1->1) |

| n-TH TIME | | (n+1)-TH TIME | | FLIP |
|---|---|---|---|---|
| Q OF 103 | a OF 101 | Q OF 103 | a OF 101 | |
| 0 | 0 | 0 | 0 | ○ (0->0) |
| | | 1 | 1 | × (0->1) |
| 1 | 1 | 0 | 0 | × (1->0) |
| | | 1 | 1 | ○ (1->1) |

Fig. 2

| n-TH TIME | | | (n+1)-TH TIME | | | FLIP |
|---|---|---|---|---|---|---|
| Q OF 203 | Q OF 204 | a OF 201 | Q OF 203 | Q OF 204 | a OF 201 | |
| 0 | 0 | 0 | 0 | 0 | 0 | ○ (0→0) |
| 0 | 1 | 0 | 1 | 0 | 0 | ○ (0→0) |
| 1 | 0 | 0 | 0 | 1 | 0 | ○ (0→0) |
| 1 | 1 | 1 | 1 | 1 | 0 | ○ (0→0) |
| | | | 0 | | 1 | ○ (0→0) |
| | | | 1 | | 0 | × (0→1) |
| | | | 0 | | 1 | × (1→0) |

Fig. 4

| | n-TH TIME | | | | (n+1)-TH TIME | | | FLIP |
|---|---|---|---|---|---|---|---|---|
| | Q OF 303 | Q OF 304 | Q OF 305 | a OF 301 | Q OF 303 | Q OF 304 | Q OF 305 | a OF 301 | |
| | 0 | 0 | 0 | 0 | 0 | 0 | 0 | 0 | ○ (0→0) |
| | 0 | 0 | 1 | 0 | 1 | 0 | 0 | 0 | ○ (0→0) |
| | 0 | 1 | 0 | 0 | 0 | 0 | 1 | 0 | ○ (0→0) |
| | 0 | 1 | 1 | 0 | 1 | 0 | 1 | 0 | ○ (0→0) |
| | 1 | 0 | 0 | 0 | 0 | 1 | 0 | 0 | ○ (0→0) |
| | 1 | 0 | 1 | 0 | 1 | 1 | 0 | 0 | ○ (0→0) |
| | 1 | 1 | 0 | 0 | 0 | 1 | 1 | 0 | ○ (0→0) |
| | 1 | 1 | 1 | 1 | 1 | 1 | 1 | 0 | ○ (0→0) |
| | | | | | 0 | 1 | 1 | 0 | ○ (0→0) |
| | | | | | 1 | 1 | 1 | 0 | ○ (0→0) |
| | | | | | 0 | 1 | 1 | 0 | ○ (0→0) |
| | | | | | 1 | 1 | 1 | 0 | ○ (0→0) |
| | | | | | 0 | 1 | 1 | 1 | × (0→1) |
| | | | | | 1 | 1 | 1 | 0 | × (1→0) |
| | | | | | | | | 1 | ○ (1→1) |

Fig. 6

| n-TH TIME | | | | (n+1)-TH TIME | | | FLIP |
|---|---|---|---|---|---|---|---|
| Q OF 403 | Q OF 404 | Q OF 405 | a OF 401 | Q OF 403 | Q OF 404 | Q OF 405 | a OF 401 | |
| 0 | 0 | 0 | 0 | 0 | 0 | 0 | 0 | ○ (0→0) |
| 0 | 0 | 1 | 0 | 1 | 0 | 0 | 0 | ○ (0→0) |
| 0 | 1 | 0 | 0 | 0 | 0 | 1 | 0 | ○ (0→0) |
| 0 | 1 | 1 | 1 | 1 | 0 | 1 | 1 | ○ (0→0) |
| 1 | 0 | 0 | 0 | 0 | 1 | 0 | 0 | × (0→1) |
| 1 | 0 | 1 | 1 | 1 | 1 | 0 | 1 | × (1→0) |
| 1 | 1 | 0 | 1 | 0 | 1 | 1 | 1 | ○ (1→1) |
| 1 | 1 | 1 | 1 | 1 | 1 | 1 | 1 | ○ (0→0) |
| | | | | 0 | 0 | 0 | 1 | × (0→1) |
| | | | | 1 | 0 | 0 | 0 | × (1→0) |
| | | | | 0 | 0 | 1 | 1 | ○ (1→1) |
| | | | | 1 | 0 | 1 | 1 | ○ (1→1) |
| | | | | 0 | 1 | 0 | 1 | ○ (1→1) |
| | | | | 1 | 1 | 0 | 1 | ○ (1→1) |
| | | | | 0 | 1 | 1 | 1 | ○ (1→1) |
| | | | | 1 | 1 | 1 | 1 | ○ (1→1) |

Fig. 8

OUTPUT CONTROL SCAN FLIP-FLOP, SEMICONDUCTOR INTEGRATED CIRCUIT INCLUDING THE SAME, AND DESIGN METHOD FOR SEMICONDUCTOR INTEGRATED CIRCUIT

CROSS-REFERENCE TO RELATED APPLICATIONS

This application is based upon and claims the benefit of priority from Japanese patent application No. 2011-186917, filed on Aug. 30, 2011, the disclosure of which is incorporated herein in its entirety by reference.

BACKGROUND

The present invention relates to an output control scan flip-flop, a semiconductor integrated circuit including the same, and a design method for the semiconductor integrated circuit.

In a scan test which is one of test methods of semiconductor integrated circuits, extremely large amount of electric power is consumed compared to a normal operation. Therefore, reduction of a peak of power consumption (hereinafter referred to as peak power consumption) at the time of the scan test is required.

In the meantime, operation speeds of recent semiconductor integrated circuits have been extremely increasing. Accordingly, it is required to prevent reduction of the operating speed at the time of the normal operation by circuit correction for the purpose of reducing peak power consumption at the time of the scan test.

One solution to such a problem is disclosed in Japanese Unexamined Patent Application Publication No. 2009-175154. As shown in FIG. 10, a semiconductor integrated circuit disclosed in Japanese Unexamined Patent Application Publication No. 2009-175154 corrects a scan flip-flop 501 which is selected as a flip-flop which gives a large influence on power consumption at the time of the shift operation of the scan test so that an output value to a combination circuit 502 is fixed during the shift operation of the scan test. Further, this semiconductor integrated circuit suppresses an increase of an area to an allowable range by limiting the number of scan flip-flops selected as a flip-flop which gives a large influence on power consumption at the time of the shift operation of the scan test based on an increment of the area that is allowed at the time of the circuit correction. Further, this semiconductor integrated circuit does not select the flip-flop which is the start point of a path between flip-flops for determining the operating speed of the circuit, thereby preventing the influence given to the function operation (normal operation).

SUMMARY

However, the present inventors have found a problem as follows. In the semiconductor integrated circuit disclosed in Japanese Unexamined Patent Application Publication No. 2009-175154, it is required to supply a control signal to a gating circuit 503 provided between the selected scan flip-flop 501 and the combination circuit 502 provided at the subsequent stage of the scan flip-flop 501. Accordingly, it is required to perform design in consideration of a line of the control signal and the like, which makes it difficult to perform design that satisfies design constraints.

A first aspect of the present invention is an output control scan flip-flop including: a first scan flip-flop that captures first data in a first mode and second data in a second mode in synchronization with a clock signal to output the data that is captured, the second data being supplied through a signal path different from a signal path of the first data; a second scan flip-flop that captures the data output from the first scan flip-flop in the second mode in synchronization with a clock signal to output the data that is captured; and a gating circuit that generates the data output from the first scan flip-flop in the first mode as output data, and generates output data having a change rate of a logic value lower than a change rate of a logic value of the data output from the first scan flip-flop based on the data output from each of the first scan flip-flop and the second scan flip-flop in the second mode.

According to the circuit configuration stated above, it is possible to reduce peak power consumption at the time of the scan test without requiring a control signal.

According to the present invention, it is possible to provide a semiconductor integrated circuit that is able to reduce peak power consumption at the time of the scan test without requiring a control signal.

BRIEF DESCRIPTION OF THE DRAWINGS

The above and other aspects, advantages and features will be more apparent from the following description of certain embodiments taken in conjunction with the accompanying drawings, in which:

FIG. 2 is a diagram for describing a flip rate of a scan flip-flop provided in the semiconductor integrated circuit before the present invention is applied;

FIG. 4 is a diagram for describing a flip rate of a simple redundant circuit provided in the semiconductor integrated circuit according to the first embodiment of the present invention;

FIG. 6 is a diagram for describing a flip rate of a simple redundant circuit provided in the semiconductor integrated circuit according to the second embodiment of the present invention;

FIG. 8 is a diagram for describing a flip rate of a simple redundant circuit provided in the semiconductor integrated circuit according to the third embodiment of the present invention;

DETAILED DESCRIPTION

Hereinafter, with reference to drawings, embodiments of the present invention will be described. Since the drawings are simplified, the technical scope of the present invention should not be narrowly interpreted based on the description of the drawings. Further, the same elements are denoted by the same reference symbols, and overlapping description will be omitted.

First Embodiment

Figure 1:
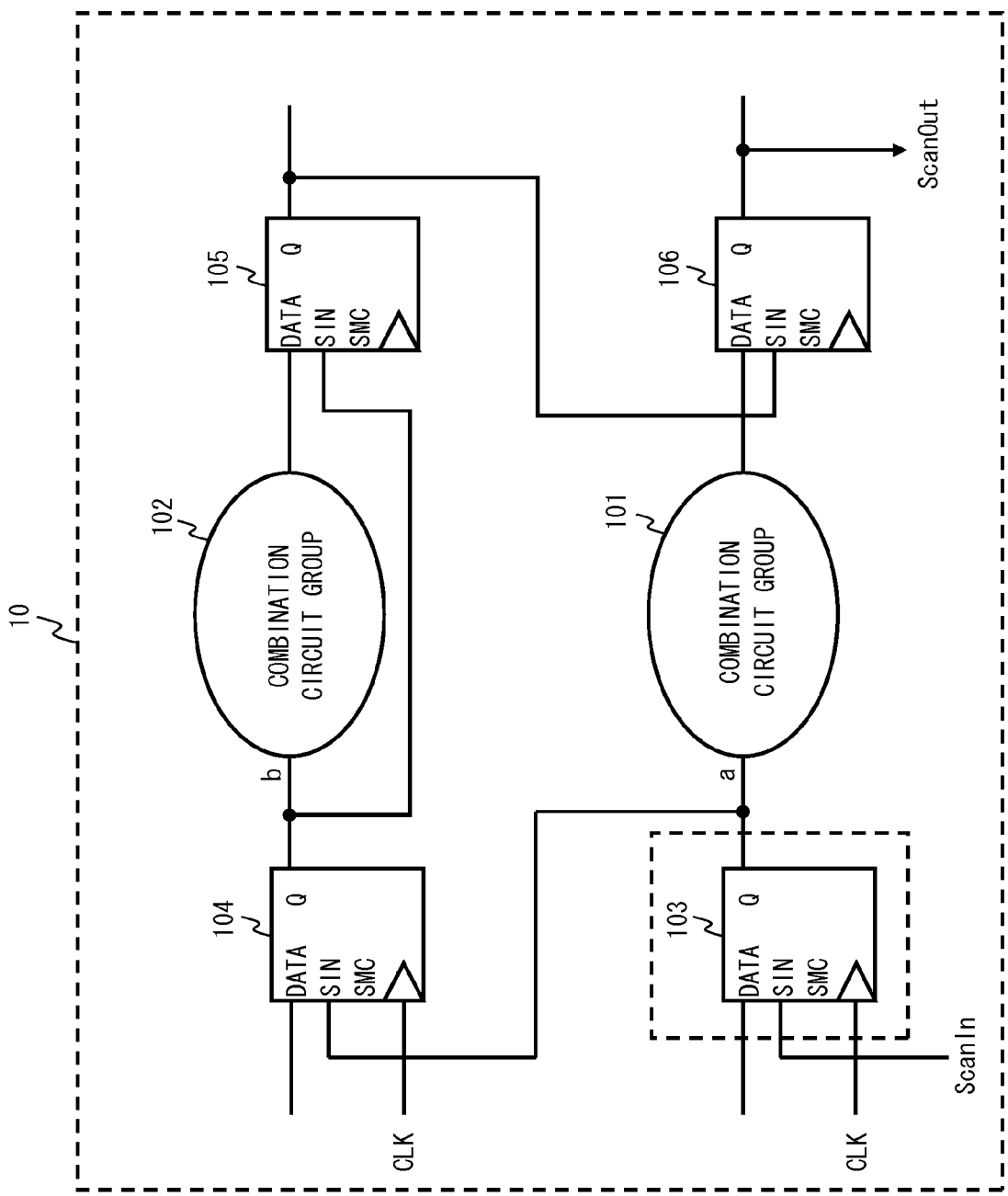
FIG. 1 is a circuit diagram showing a configuration of a semiconductor integrated circuit before the present invention is applied.

Before describing a semiconductor integrated circuit according to a first embodiment of the present invention, a semiconductor integrated circuit before the present invention is applied will be described first with reference to FIG. 1. FIG. 1 is a circuit diagram showing a configuration of a semiconductor integrated circuit 10 before the present invention is applied.

The semiconductor integrated circuit 10 shown in FIG. 1 includes a combination circuit group 101 including a plurality of combination circuits, a combination circuit group 102 including a plurality of combination circuits, and scan flip-flops 103 to 106.

Each of the scan flip-flops 103 to 106 includes an input terminal SIN, an input terminal DATA, an input terminal SMC, a clock input terminal CLK, and a data output terminal Q. Data to be captured during a shift operation of a scan test is supplied to the input terminal SIN of each of the scan flip-flops 103 to 106. Data to be captured during a normal operation and a capture operation of the scan test is supplied to the input terminal DATA of each of the scan flip-flops 103 to 106. An enable signal that controls which data to capture of the data supplied to the input terminal SIN and data supplied to the input terminal DATA is supplied to the input terminal SMC of each of the scan flip-flops 103 to 106. A clock signal is supplied to the clock input terminal CLK of each of the scan flip-flops 103 to 106. Then, data is output from the data output terminal Q of each of the scan flip-flops 103 to 106.

In short, each of the scan flip-flops 103 to 106 selects one of data supplied to the input terminal SIN and data supplied to the input terminal DATA based on the enable signal. Then, each of the scan flip-flops 103 to 106 captures the selected data in synchronization with the rising of the clock signal and outputs the captured data from the data output terminal Q.

The scan flip-flops 103 to 106 are successively connected in series to form a scan chain. To be more specific, the scan chain is connected as follows. The data output terminal Q of the scan flip-flop 103 is connected to the input terminal SIN of the scan flip-flop 104. The data output terminal Q of the scan flip-flop 104 is connected to the input terminal SIN of the scan flip-flop 105. The data output terminal Q of the scan flip-flop 105 is connected to the input terminal SIN of the scan flip-flop 106. The data output terminal Q of the scan flip-flop 106 is connected to a scan out terminal (ScanOut) of the scan chain. While the case in which four scan flip-flops 103 to 106 are provided is described as an example in FIG. 1, it is not limited to this. If another scan flip-flop is provided at the subsequent stage of the scan flip-flop 106, the data output terminal Q of the scan flip-flop 106 is connected to an input terminal SIN of the subsequent scan flip-flop. Then, a data output terminal Q of the last-stage scan flip-flop is connected to the scan out terminal of the scan chain.

Further, the input terminal SIN of the scan flip-flop 103 is connected to a scan in terminal (ScanIN) of the scan chain. While the case in which four scan flip-flops 103 to 106 are provided is described as an example in FIG. 1, it is not limited to this. If another scan flip-flop is provided at the previous stage of the scan flip-flop 103, the input terminal SIN of the scan flip-flop 103 is connected to a data output terminal Q of the previous scan flip-flop. Then, an input terminal SIN of the first-stage scan flip-flop is connected to the scan in terminal of the scan chain.

As described above, the plurality of scan flip-flops are connected between the scan in terminal and the scan out terminal to form a scan chain.

The combination circuit group 101 performs a logical operation on the data output from the scan flip-flop 103, and outputs the operation result to the scan flip-flop 106. Note that the output terminal Q of the scan flip-flop 103 is connected to an input a of the combination circuit group 101.

The combination circuit group 102 performs a logical operation on the data output from the scan flip-flop 104, and outputs the operation result to the scan flip-flop 105. Note that the output terminal Q of the scan flip-flop 104 is connected to an input b of the combination circuit group 102.

Next, an operation of the semiconductor integrated circuit 10 shown in FIG. 1 will be described in brief.

In the normal operation, the enable signal indicates an L level, for example. In this case, the scan flip-flops 103 to 106 each capture data supplied to the input terminal DATA in synchronization with the clock signal, and output the data from the data output terminal Q. At this time, the combination circuit groups 101 and 102 respectively perform a logical operation on the data output from the scan flip-flops 103 and 104, and respectively output the operation result to the subsequent scan flip-flops 106 and 105.

On the other hand, in the scan test, there are two modes of a shift mode and a capture mode. In the shift mode, the enable signal indicates an H level, for example. In this case, the scan flip-flops 103 to 106 each capture data supplied to the input terminal SIN in synchronization with the clock signal, and output the data from the data output terminal Q. In the capture mode, the enable signal indicates an L level, for example. In this case, the scan flip-flops 103 to 106 each capture the data supplied to the input terminal DATA in synchronization with the clock signal, and output the data from the data output terminal Q.

Typically, in the scan test, when the test is started, test data is supplied from an LSI tester to the scan in terminal of the semiconductor integrated circuit 10. In the similar way, a clock signal is supplied from the LSI tester to the clock input terminal CLK of each scan flip-flop provided in the semiconductor integrated circuit 10. Further, an enable signal is supplied from the LSI tester to the input terminal SMC of each scan flip-flop provided in the semiconductor integrated circuit 10.

First, by raising the clock signal by the number of stages of the scan chain in the shift mode, test data is captured by the plurality of scan flip-flops forming the scan chain. Next, by raising once the clock signal in the capture mode, data supplied to the input terminal DATA is captured by each of the plurality of scan flip-flops forming the scan chain. Next, by raising the clock signal by the number of stages of the scan chain in the second shift mode, data captured by the plurality of scan flip-flops (capture data) forming the scan chain is output from the scan out terminal. The LSI tester compares an expected value data with the data output from the scan out terminal of the semiconductor integrated circuit 10, thereby detecting failures of the semiconductor integrated circuit 10.

In the shift operation of the scan test, each scan flip-flop captures test data every time the clock signal is raised. Accordingly, the logic value of the data output from a scan flip-flop at the n (n is a natural number)-th rising of the clock signal may be different from the logic value of the data output from the scan flip-flop at the (n+1)-th rising of the clock signal. In this case, the logic values of the data output from the plurality of combination circuits forming the subsequent combination circuit group change. In other words, the logic values of a plurality of nodes of the subsequent combination circuit group change. Thus, the peak power consumption increases.

On the other hand, when the logic value of the data output from a scan flip-flop at the n-th rising of the clock signal is not different from the logic value of the data output from the scan flip-flop at the (n+1)-th rising of the clock signal, the logic values of the plurality of nodes of the subsequent combination circuit group do not change. Thus, the peak power consumption does not increase.

In the following description, the probability in which the logic value of the data output from a scan flip-flop at the n-th rising of the clock signal is different from the logic value of the data output from the scan flip-flop at the (n+1)-th rising of the clock signal in the shift operation of the scan test is denoted by a "flip rate" of the scan flip-flop.

Next, with reference to FIG. 2, a flip rate of the scan flip-flop 103 will be described. FIG. 2 is a diagram for describing the flip rate of the scan flip-flop 103 provided in the semiconductor integrated circuit 10.

FIG. 2 shows all the combinations of the logic value of the data output from the scan flip-flop 103 at the n-th rising of the clock signal and the logic value of the data output from the scan flip-flop 103 at the (n+1)-th rising of the clock signal. FIG. 2 also shows the logic values of data supplied to the input a of the combination circuit group 101 at this time (see "a of 101").

Further, in the "flip" shown in FIG. 2, a case in which the logic value of the data output from the scan flip-flop 103 changes between the n-th rising of the clock signal and the (n+1)-th rising of the clock signal is indicated by "x". Further, a case in which the logic value of the data output from the scan flip-flop 103 does not change between the n-th rising of the clock signal and the (n+1)-th rising of the clock signal is indicated by "○". In each parentheses, the logic value of the data output from the scan flip-flop 103 at the n-th rising of the clock signal is shown on the left side of the arrow. Further, the logic value of the data output from the scan flip-flop 103 at the (n+1)-th rising of the clock signal is shown on the right side of the arrow.

As shown in FIG. 2, the logic value of the data output from the scan flip-flop 103 is changed in two ways among four combinations. Thus, the flip rate of the scan flip-flop 103 is 2/4=50%.

Figure 3:
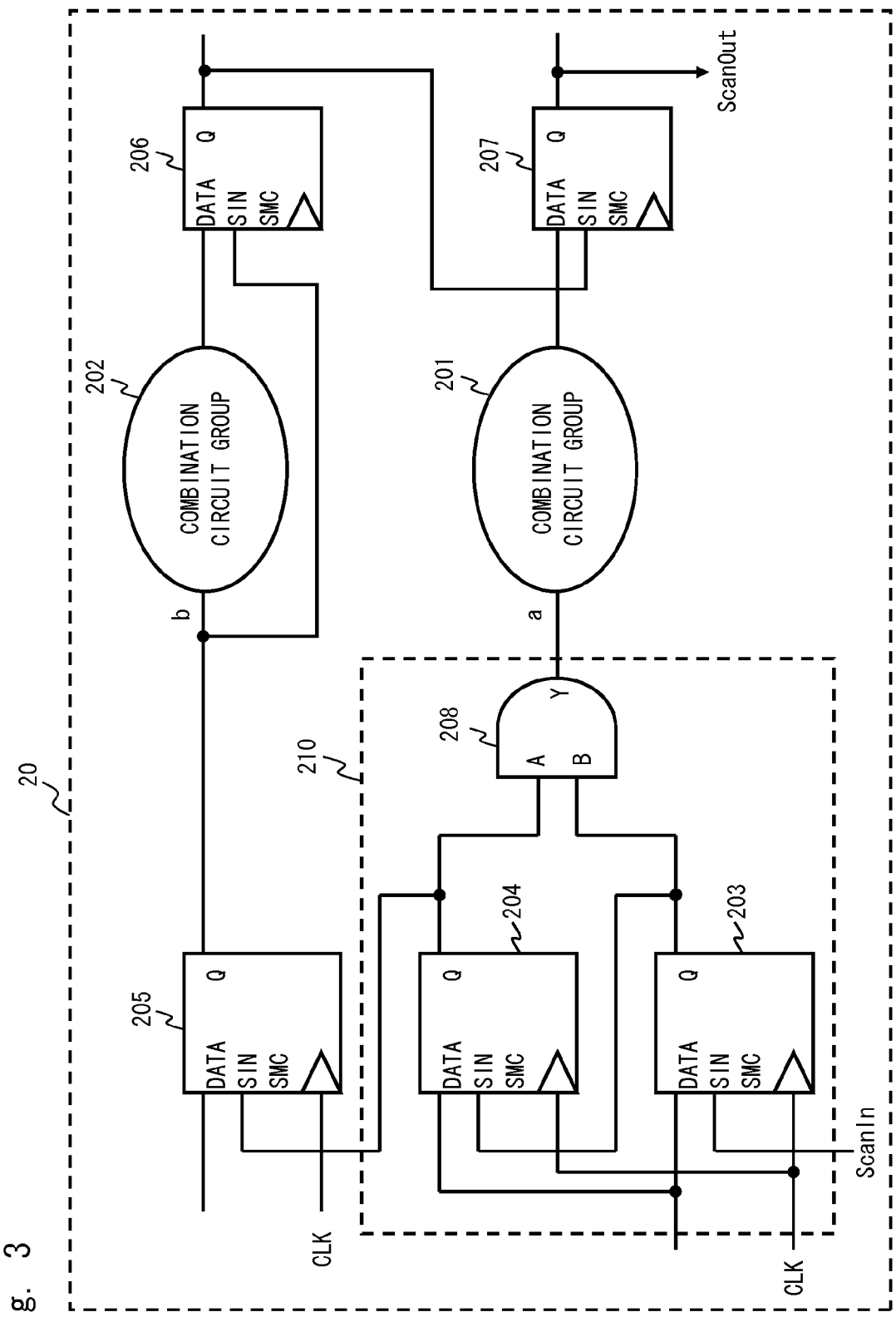
FIG. 3 is a circuit diagram showing a configuration of a semiconductor integrated circuit according to a first embodiment of the present invention.

Next, with reference to FIG. 3, a semiconductor integrated circuit 20 according to the first embodiment will be described. FIG. 3 is a circuit diagram showing a configuration of the semiconductor integrated circuit 20 according to the first embodiment. Note that the semiconductor integrated circuit 20 shown in FIG. 3 is a circuit in which the present invention is applied to the semiconductor integrated circuit 10 shown in FIG. 1.

The semiconductor integrated circuit 20 shown in FIG. 3 includes a combination circuit group 201 including a plurality of combination circuits, a combination circuit group 202 including a plurality of combination circuits, a simple redundant circuit (output control scan flip-flop) 210, and scan flip-flops 205 to 207. The simple redundant circuit 210 includes a scan flip-flop (first scan flip-flop) 203, a scan flip-flop (second scan flip-flop) 204, and a logical AND circuit (hereinafter simply referred to as an AND circuit) 208 as a gating circuit.

The combination circuit groups 201 and 202 respectively correspond to the combination circuit groups 101 and 102, the simple redundant circuit 210 corresponds to the scan flip-flop 103, and the scan flip-flops 205 to 207 respectively correspond to the scan flip-flops 104 to 106. In the semiconductor integrated circuit 20 shown in FIG. 3, the scan flip-flop 103 in the semiconductor integrated circuit 10 shown in FIG. 1 is replaced with the simple redundant circuit 210.

Each of the scan flip-flops 203 to 207 includes an input terminal SIN, an input terminal DATA, an input terminal SMC, a clock input terminal CLK, and a data output terminal Q. Data (second data) to be captured during the shift operation (second mode) of the scan test is supplied to the input terminal SIN of each of the scan flip-flops 203 to 207. Data (first data) to be captured during the normal operation (first mode) and the capture operation of the scan test is supplied to the input terminal DATA of each of the scan flip-flops 203 to 207. An enable signal that controls which data to capture of the data supplied to the input terminal SIN and the data supplied to the input terminal DATA is supplied to the input terminal SMC of each of the scan flip-flops 203 to 207. A clock signal is supplied to the clock input terminal CLK of each of the scan flip-flops 203 to 207. Then, the data is output from the data output terminal Q of each of the scan flip-flops 203 to 207.

In short, each of the scan flip-flops 203 to 207 selects one of data supplied to the input terminal SIN and data supplied to the input terminal DATA based on the enable signal. Then, each of the scan flip-flops 203 to 207 captures the selected data in synchronization with the rising of the clock signal and outputs the captured data from the data output terminal Q.

The scan flip-flops 203 to 207 are successively connected in series to form a scan chain. To be more specific, the scan chain is connected as follows. The data output terminal Q of the scan flip-flop 203 is connected to the input terminal SIN of the scan flip-flop 204. The data output terminal Q of the scan flip-flop 204 is connected to the input terminal SIN of the scan flip-flop 205. The data output terminal Q of the scan flip-flop 205 is connected to the input terminal SIN of the scan flip-flop 206. The data output terminal Q of the scan flip-flop 206 is connected to the input terminal SIN of the scan flip-flop 207. The data output terminal Q of the scan flip-flop 207 is connected to a scan out terminal (ScanOut) of the scan chain. While the case in which five scan flip-flops 203 to 207 are provided is described as an example in FIG. 3, it is not limited to this. If another scan flip-flop is provided at the subsequent stage of the scan flip-flop 207, the data output terminal Q of the scan flip-flop 207 is connected to an input terminal SIN of the subsequent scan flip-flop. Then, a data output terminal Q of the last-stage scan flip-flop is connected to the scan out terminal of the scan chain.

Further, the input terminal SIN of the scan flip-flop 203 is connected to a scan in terminal (ScanIN) of the scan chain. While the case in which five scan flip-flops 203 to 207 are provided is described as an example in FIG. 3, it is not limited to this. If another scan flip-flop is provided at a previous stage of the scan flip-flop 203, the input terminal SIN of the scan flip-flop 203 is connected to a data output terminal Q of the previous scan flip-flop. Then, an input terminal SIN of the first-stage scan flip-flop is connected to the scan in terminal of the scan chain.

As described above, the connection of the plurality of scan flip-flops between the scan in terminal and the scan out terminal forms the scan chain.

The data output terminal Q of the scan flip-flop 204 is connected to an input terminal A of the AND circuit 208. The data output terminal Q of the scan flip-flop 203 is connected to an input terminal B of the AND circuit 208. Then, the logical AND of the data output from the scan flip-flops 203 and 204 is output from an output terminal Y of the AND circuit 208.

The combination circuit group 201 performs logical operation on the data output from the AND circuit 208, and outputs the operation result to the scan flip-flop 207. Note that the output terminal Y of the AND circuit 208 is connected to an input a of the combination circuit group 201.

The combination circuit group 202 performs logical operation on the data output from the scan flip-flop 205, and outputs the operation result to the scan flip-flop 206. Note that the output terminal Q of the scan flip-flop 205 is connected to an input b of the combination circuit group 202.

Note that, in the simple redundant circuit 210, common data is supplied to the input terminal DATA of each of the scan flip-flops 203 and 204. Further, a common clock signal is supplied to the clock input terminal CLK of each of the scan flip-flops 203 and 204. Accordingly, in the normal operation, the scan flip-flop 203, 204 capture common data in synchronization with the clock signal, and output the data to the AND circuit 208. Then the AND circuit 208 outputs the data having the same logic value to the data supplied to both input terminals A and B. In summary, in the normal operation, the simple redundant circuit 210 performs the similar operation as that of the scan flip-flop 103. Other basic operations of the semiconductor integrated circuit 20 shown in FIG. 3 are similar to those of the semiconductor integrated circuit 10 shown in FIG. 1, and thus description thereof will be omitted.

Next, a flip rate of the simple redundant circuit 210 in place of the scan flip-flop 103 will be described with reference to FIG. 4. FIG. 4 is a diagram for describing a flip rate of the simple redundant circuit 210 provided in the semiconductor integrated circuit 20. Note that the flip rate of the simple redundant circuit 210 means the probability in which the logic value of the data output from the simple redundant circuit 210 at the n-th rising of the clock signal is different from the logic value of the data output from the simple redundant circuit 210 at the (n+1)-th rising of the clock signal in the shift operation of the scan test.

FIG. 4 shows all the combinations of the logic value of the data output from each of the scan flip-flops 203 and 204 at the n-th rising of the clock signal and the logic value of the data output from each of the scan flip-flops 203 and 204 at the (n+1)-th rising of the clock signal. Further, FIG. 4 also shows the logic values of the data supplied to the input a of the combination circuit group 201, i.e., the logic values of the data output from the AND circuit 208 (see "a of 201").

Further, in the "flip" shown in FIG. 4, a case in which the logic value of the data output from the simple redundant circuit 210 changes between the n-th rising of the clock signal and the (n+1)-th rising of the clock signal is shown by "x". Further, a case in which the logic value of the data output from the simple redundant circuit 210 does not change between the n-th rising of the clock signal and the (n+1)-th rising of the clock signal is shown by "○". Note that, in parenthesis, the logic value of the data output from the simple redundant circuit 210 at the n-th rising of the clock signal is shown on the left side of the arrow. Further, the logic value of the data output from the simple redundant circuit 210 at the (n+1)-th rising of the clock signal is shown on the right side of the arrow.

Here, the data output terminal Q of the scan flip-flop 203 is connected to the input terminal SIN of the scan flip-flop 204. Thus, the logic value of the data output from the scan flip-flop 203 at the n-th rising of the clock signal and the logic value of the data output from the scan flip-flop 204 at the (n+1)-th rising of the clock signal indicate the same value.

As shown in FIG. 4, the logic value of the data output from the simple redundant circuit 210 varies in two ways among eight combinations. Thus, the flip rate of the simple redundant circuit 210 is 2/8=25%. In summary, the flip rate of the simple redundant circuit 210 is lower than the flip rate (50%) of the scan flip-flop 103 shown in FIG. 1.

Accordingly, power consumed in the combination circuit group 201 provided at the subsequent stage of the simple redundant circuit 210 is smaller than power consumed in the combination circuit group 101 provided at the subsequent stage of the scan flip-flop 103 shown in FIG. 1.

As described above, the semiconductor integrated circuit 20 according to the first embodiment is able to reduce peak power consumption at the time of the scan test compared to the case of the semiconductor integrated circuit 10 shown in FIG. 1. In particular, by replacing the scan flip-flop which gives a large influence on peak power consumption with the simple redundant circuit according to the present invention, it is possible to efficiently reduce peak power consumption.

Further, with the semiconductor integrated circuit 20 according to the first embodiment, it is possible to reduce peak power consumption at the time of the scan test without requiring a control signal unlike the related art.

While the case in which the AND circuit 208 is provided in the simple redundant circuit 210 has been described as an example in the first embodiment, it is not limited to this. Another circuit configuration including other logic circuit than the AND circuit 208, such as a logical OR circuit, may be used instead as long as the similar operation as that of the scan flip-flop 103 can be achieved in the normal operation and the capture operation of the scan test and the flip rate lower than that in the scan flip-flop 103 can be achieved at the shift operation of the scan test.

For example, as a configuration for achieving the similar operation as that of the scan flip-flop 103 in the normal operation and the capture operation of the scan test, the simple redundant circuit 210 may have a circuit configuration of directly outputting data output from one of the scan flip-flops 203 and 204 in the normal operation and the capture operation of the scan test. In this case, data may be supplied only to the input terminal DATA of the corresponding scan flip-flop in the normal operation and the capture operation of the scan test.

Second Embodiment

Figure 5:
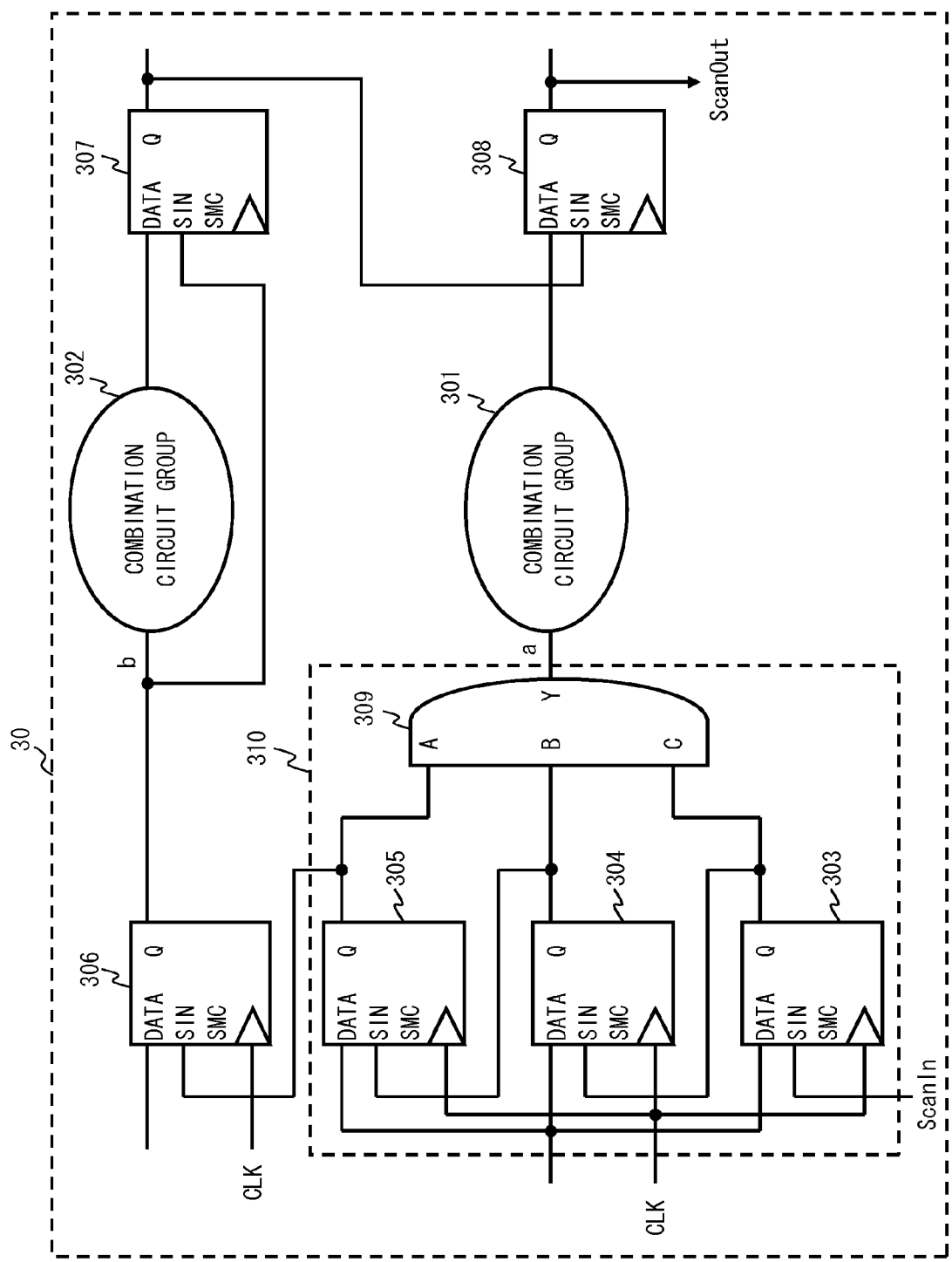
FIG. 5 is a circuit diagram showing a configuration of a semiconductor integrated circuit according to a second embodiment of the present invention.

FIG. 5 is a circuit diagram showing a configuration of a semiconductor integrated circuit 30 according to a second embodiment of the present invention. The semiconductor integrated circuit 30 shown in FIG. 5 includes a simple redundant circuit 310 having a configuration different from that described in the first embodiment. Description will be made hereinafter in detail.

The semiconductor integrated circuit 30 shown in FIG. 5 includes a combination circuit group 301 including a plurality of combination circuits, a combination circuit group 302 including a plurality of combination circuits, the simple redundant circuit (output control scan flip-flop) 310, and scan flip-flops 306 to 308. The simple redundant circuit 310 includes a scan flip-flop (first scan flip-flop) 303, a scan flip-flop (second scan flip-flop) 304, a scan flip-flop (third scan flip-flop) 305, and an AND circuit 309 as a gating circuit.

The combination circuit groups 301 and 302 respectively correspond to the combination circuit groups 101 and 102, the simple redundant circuit 310 corresponds to the scan flip-flop 103, and the scan flip-flops 306 to 308 respectively correspond to the scan flip-flops 104 to 106. In the semiconductor integrated circuit 30 shown in FIG. 5, the scan flip-flop 103 in the semiconductor integrated circuit 10 shown in FIG. 1 is replaced with the simple redundant circuit 310.

The scan flip-flops 303 to 308 are successively connected in series to form a scan chain. To be more specific, this scan chain is connected as follows. The data output terminal Q of the scan flip-flop 303 is connected to the input terminal SIN of the scan flip-flop 304. The data output terminal Q of the scan flip-flop 304 is connected to the input terminal SIN of the scan flip-flop 305. The data output terminal Q of the scan flip-flop 305 is connected to the input terminal SIN of the scan flip-flop 306. The data output terminal Q of the scan flip-flop 306 is connected to the input terminal SIN of the scan flip-flop 307. The data output terminal Q of the scan flip-flop 307 is connected to the input terminal SIN of the scan flip-flop 308. The data output terminal Q of the scan flip-flop 308 is connected to a scan out terminal (ScanOut) of the scan chain. While the example in which six scan flip-flops 303 to 308 are provided is described as an example in FIG. 5, it is not limited to this. If another scan flip-flop is provided at the subsequent stage of the scan flip-flop 308, the data output terminal Q of the scan flip-flop 308 is connected to an input terminal SIN of the subsequent scan flip-flop. Then, a data output terminal Q of the last-stage scan flip-flop is connected to the scan out terminal of the scan chain.

Further, the input terminal SIN of the scan flip-flop 303 is connected to a scan in terminal (ScanIN) of the scan chain. While the example in which six scan flip-flops 303 to 308 are provided is described as an example in FIG. 5, it is not limited to this. If another scan flip-flop is provided at a previous stage of the scan flip-flop 303, the input terminal SIN of the scan flip-flop 303 is connected to a data output terminal Q of the previous scan flip-flop. Then, an input terminal SIN of the first-stage scan flip-flop is connected to the scan in terminal of the scan chain.

In this way, the connection of the plurality of scan flip-flops between the scan in terminal and the scan out terminal forms the scan chain.

The data output terminal Q of the scan flip-flop 305 is connected to an input terminal A of the AND circuit 309. The data output terminal Q of the scan flip-flop 304 is connected to an input terminal B of the AND circuit 309. The data output terminal Q of the scan flip-flop 303 is connected to an input terminal C of the AND circuit 309. Then, the logical AND of the data output from the scan flip-flops 303 to 305 is output from an output terminal Y of the AND circuit 309.

The combination circuit group 301 performs logical operation on the data output from the AND circuit 309, and outputs the operation result to the scan flip-flop 308. The output terminal Y of the AND circuit 309 is connected to an input a of the combination circuit group 301.

The combination circuit group 302 performs logical operation on the data output from the scan flip-flop 306, and outputs the operation result to the scan flip-flop 307. The output terminal Q of the scan flip-flop 306 is connected to an input b of the combination circuit group 302.

Note that, in the simple redundant circuit 310, common data is supplied to the input terminal DATA of each of the scan flip-flops 303 to 305. Further, a common clock signal is supplied to the clock input terminal CLK of each of the scan flip-flops 303 to 305. Accordingly, in the normal operation, the scan flip-flops 303 to 305 capture the common data in synchronization with the clock signal, and output the data to the AND circuit 309. Then, the AND circuit 309 outputs the data having the same logic value to the data supplied to the input terminals A, B, and C. In summary, in the normal operation, the simple redundant circuit 310 performs the similar operation as that of the scan flip-flop 103. Other basic operations of the semiconductor integrated circuit 30 shown in FIG. 5 are similar to those of the semiconductor integrated circuit 10 shown in FIG. 1, and thus description thereof will be omitted.

Next, with reference to FIG. 6, a flip rate of the simple redundant circuit 310 in place of the scan flip-flop 103 will be described. FIG. 6 is a diagram for describing a flip rate of the simple redundant circuit 310 provided in the semiconductor integrated circuit 30. Note that the flip rate of the simple redundant circuit 310 means the probability in which the logic value of the data output from the simple redundant circuit 310 at the n-th rising of the clock signal is different from the logic value of the data output from the simple redundant circuit 310 at the (n+1)-th rising of the clock signal in the shift operation of the scan test.

FIG. 6 shows all the combinations of the logic value of the data output from each of the scan flip-flops 303 to 305 at the n-th rising of the clock signal and the logic value of the data output from each of the scan flip-flops 303 to 305 at the (n+1)-th rising of the clock signal. FIG. 6 further shows the logic values of the data supplied to the input a of the combination circuit group 301, i.e., the logic values of the data output from the AND circuit 309 (see "a of 301").

Further, in the "flip" shown in FIG. 6, a case in which the logic value of the data output from the simple redundant circuit 310 changes between the n-th rising of the clock signal and the (n+1)-th rising of the clock signal is shown by "x". Further, a case in which the logic value of the data output from the simple redundant circuit 310 does not change between the n-th rising of the clock signal and the (n+1)-th rising of the clock signal is shown by "○". In each parentheses, the logic value of the data output from the simple redundant circuit 310 at the n-th rising of the clock signal is shown on the left side of the arrow. Further, the logic value of the data output from the simple redundant circuit 310 at the (n+1)-th rising of the clock signal is shown on the right side of the arrow.

Here, the data output terminal Q of the scan flip-flop 303 is connected to the input terminal SIN of the scan flip-flop 304. Accordingly, the logic value of the data output from the scan flip-flop 303 at the n-th rising of the clock signal and the logic value of the data output from the scan flip-flop 304 at the (n+1)-th rising of the clock signal indicate the same value.

In the similar way, the data output terminal Q of the scan flip-flop 304 is connected to the input terminal SIN of the scan flip-flop 305. Thus, the logic value of the data output from the scan flip-flop 304 at the n-th rising of the clock signal and the logic value of the data output from the scan flip-flop 305 at the (n+1)-th rising of the clock signal indicate the same value.

As shown in FIG. 6, the logic value of the data output from the simple redundant circuit 310 varies in two ways among 16 combinations. Thus, the flip rate of the simple redundant circuit 310 is $2/16=12.5\%$. In short, the flip rate of the simple redundant circuit 310 is further lower than the flip rate (25%) of the simple redundant circuit 210 shown in FIG. 3.

Accordingly, power consumed in the combination circuit group 301 provided at the subsequent stage of the simple redundant circuit 310 is further smaller than power consumed in the combination circuit group 201 provided at the subsequent stage of the simple redundant circuit 210 shown in FIG. 3.

As described above, the semiconductor integrated circuit 30 according to the second embodiment is able to further reduce peak power consumption at the time of scan test compared to the case of the semiconductor integrated circuit 20 shown in FIG. 3. In particular, it is possible to efficiently reduce peak power consumption by replacing the scan flip-flop which gives a large influence on peak power consumption with the simple redundant circuit according to the present invention.

Further, with the semiconductor integrated circuit 30 according to the second embodiment, it is able to reduce peak power consumption at the time of the scan test without requiring a control signal unlike the related art.

Third Embodiment

Figure 7:
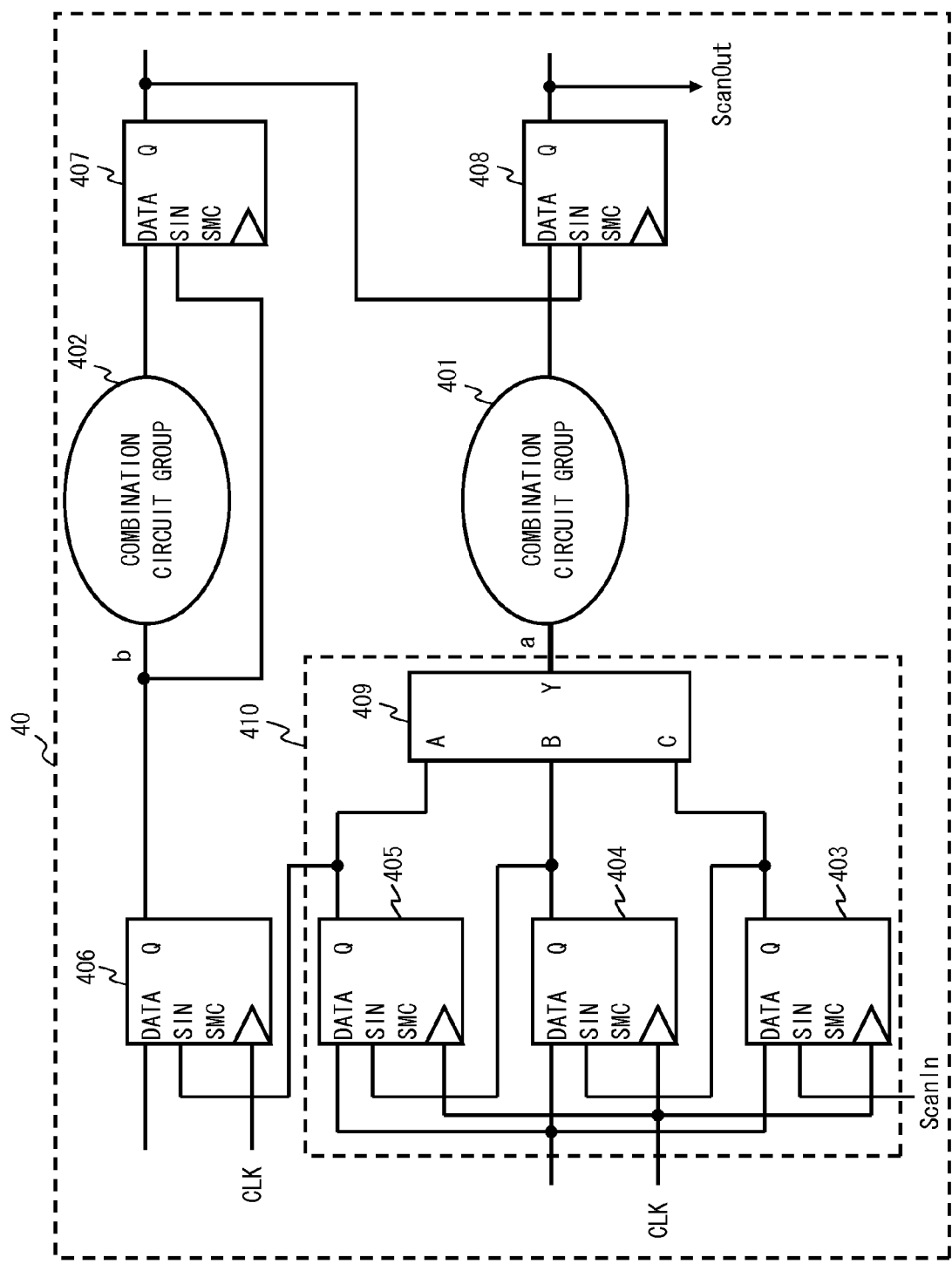
FIG. 7 is a circuit diagram showing a configuration of a semiconductor integrated circuit according to a third embodiment of the present invention.

FIG. 7 is a circuit diagram showing a configuration of a semiconductor integrated circuit 40 according to a third embodiment of the present invention. The semiconductor integrated circuit 40 shown in FIG. 7 includes a simple redundant circuit 410 having a configuration different from that described in the embodiments. Description will be made hereinafter in detail.

The semiconductor integrated circuit 40 shown in FIG. 7 includes a combination circuit group 401 including a plurality of combination circuits, a combination circuit group 402 including a plurality of combination circuits, the simple redundant circuit (output control scan flip-flop) 410, and scan flip-flops 406 to 408. The simple redundant circuit 410 includes a scan flip-flop (first scan flip-flop) 403, a scan flip-flop (second scan flip-flop) 404, a scan flip-flop (third scan flip-flop) 405, and a three-input majority circuit (3 bit-majority circuit) 409 as a gating circuit. In short, the simple redundant circuit 410 includes the three-input majority circuit 409 in place of the AND circuit 309 compared to the simple redundant circuit 310. The three-input majority circuit 409 is a circuit for outputting the data of a logic value which occupies majority of three input data. Note that, in the case of the normal operation, the simple redundant circuit 410 performs the similar operation as that of the scan flip-flop 103.

Note that the combination circuit groups 401 and 402 respectively correspond to the combination circuit groups 301 and 302 in FIG. 5, and the scan flip-flops 403 to 408 each correspond to the scan flip-flops 303 to 308. The circuit configurations and operations of other circuits than the three-input majority circuit 409 are similar to those in the semiconductor integrated circuit 30 shown in FIG. 5, and thus description thereof will be omitted.

Next, with reference to FIG. 8, a flip rate of the simple redundant circuit 410 in place of the scan flip-flop 103 will be described. FIG. 8 is a diagram for describing a flip rate of the simple redundant circuit 410 provided in the semiconductor integrated circuit 40. Note that the flip rate of the simple redundant circuit 410 means the probability in which the logic value of the data output from the simple redundant circuit 410 at the n-th rising of the clock signal is different from the logic value of the data output from the simple redundant circuit 410 at the (n+1)-th rising of the clock signal in the shift operation of the scan test.

FIG. 8 shows all the combinations of the logic value of the data output from each of the scan flip-flops 403 to 405 at the n-th rising of the clock signal and the logic value of the data output from each of the scan flip-flops 403 to 405 at the (n+1)-th rising of the clock signal. FIG. 8 further shows the logic values of the data supplied to an input a of the combination circuit group 401, i.e., the logic values of the data output from the three-input majority circuit 409 (see "a of 401").

Further, in the "flip" shown in FIG. 8, a case in which the logic value of the data output from the simple redundant circuit 410 changes between the n-th rising of the clock signal and the (n+1)-th rising of the clock signal is shown by "x". Further, a case in which the logic value of the data output from the simple redundant circuit 410 does not change between the n-th rising of the clock signal and the (n+1)-th rising of the clock signal is shown by "○". In each parentheses, the logic value of the data output from the simple redundant circuit 410 at the n-th rising of the clock signal is shown on the left side of the arrow. Further, the logic value of the data output from the simple redundant circuit 410 at the (n+1)-th rising of the clock signal is shown on the right side of the arrow.

Here, the data output terminal Q of the scan flip-flop 403 is connected to the input terminal SIN of the scan flip-flop 404. Accordingly, the logic value of the data output from the scan flip-flop 403 at the n-th rising of the clock signal and the logic value of the data output from the scan flip-flop 404 at the (n+1)-th rising of the clock signal indicate the same value.

In the similar way, the data output terminal Q of the scan flip-flop 404 is connected to the input terminal SIN of the scan flip-flop 405. Accordingly, the logic value of the data output from the scan flip-flop 404 at the n-th rising of the clock signal and the logic value of the data output from the scan flip-flop 405 at the (n+1)-th rising of the clock signal indicate the same value.

As shown in FIG. 8, the logic value of the data output from the simple redundant circuit 410 varies in four ways among 16 combinations. Accordingly, the flip rate of the simple redundant circuit 410 is $4/16=25\%$. This means that the flip rate of the simple redundant circuit 410 is equal to the flip rate (25%) of the simple redundant circuit 210 shown in FIG. 3. In summary, the semiconductor integrated circuit 40 according to the third embodiment is able to achieve the similar effect to the semiconductor integrated circuit 20 shown in FIG. 3.

While the example in which the three-input majority circuit 409 is provided in the simple redundant circuit 410 has been described as an example in the third embodiment, it is not limited to this. Another circuit configuration including other logic circuit than the three-input majority circuit 409, such as a logical OR circuit, may be used instead as long as the similar operation as the scan flip-flop 103 can be achieved in the normal operation and the capture operation of the scan test and the flip rate lower than that in the scan flip-flop 103 can be achieved at the shift operation of the scan test.

For example, as the configuration for achieving the similar operation as that of the scan flip-flop 103 in the normal operation and the capture operation of the scan test, the simple redundant circuit 410 may have a circuit configuration for directly outputting the data output from any one of the scan flip-flops 403 to 405 in the normal operation and the capture operation of the scan test. In this case, it is only required that the data is supplied only to the input terminal DATA of the corresponding scan flip-flop in the normal operation and the capture operation of the scan test.

As described above, with the semiconductor integrated circuit according to the first to third embodiments stated above, peak power consumption at the time of the scan test can be reduced compared to the case of the semiconductor integrated circuit before the present invention is applied. In particular, by replacing the scan flip-flop which gives a large influence on peak power consumption with the simple redundant circuit according to the present invention, peak power consumption can be efficiently reduced.

Further, with the semiconductor integrated circuit according to the first to third embodiments stated above, it is possible to reduce peak power consumption at the time of the scan test without requiring a control signal unlike the related art. Accordingly, there is no need to perform design in consideration of a line of the control signal, and the design which satisfies design constraints may be easily achieved.

Further, while the case in which the test data (test pattern) is generated by the LSI tester provided outside the semiconductor integrated circuit has been described as an example in the above embodiment, it is not limited to this. The test data may be generated using a test data generation circuit provided inside the semiconductor integrated circuit. Further, while the case has been described in which the test result by the scan test is directly output outside the semiconductor integrated circuit as an example in the above embodiment, it is not limited to this. The test result may be output outside the semiconductor integrated circuit after being compressed by a data compress circuit provided inside the semiconductor integrated circuit 20. In summary, the present invention may also be applied to the semiconductor integrated circuit in which a built-in self test method (so-called a BIST method) is employed.

Further, the replacement of the scan flip-flop with the simple redundant circuit according to the present invention can be executed by any desired design process. For example, in a register transfer level (RTL) design stage, target RTL description may be replaced with RTL description corresponding to the simple redundant circuit (A in FIG. 9). In the RTL description corresponding to the simple redundant circuit, each of a plurality of scan flip-flops is described as a normal flip-flop. In summary, in the RTL design stage, the scan chain and its connection terminals are not considered. This RTL description is converted into the scan flip-flop by a logic synthesis tool in the later process. In this way, replacement of the target RTL description with the simple redundant circuit is finally conducted.

Figure 9:
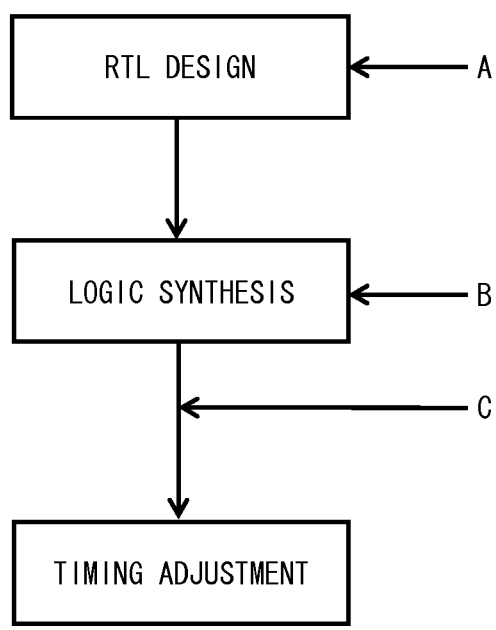
FIG. 9 is a diagram showing a design process of the semiconductor integrated circuit.
Figure 10:
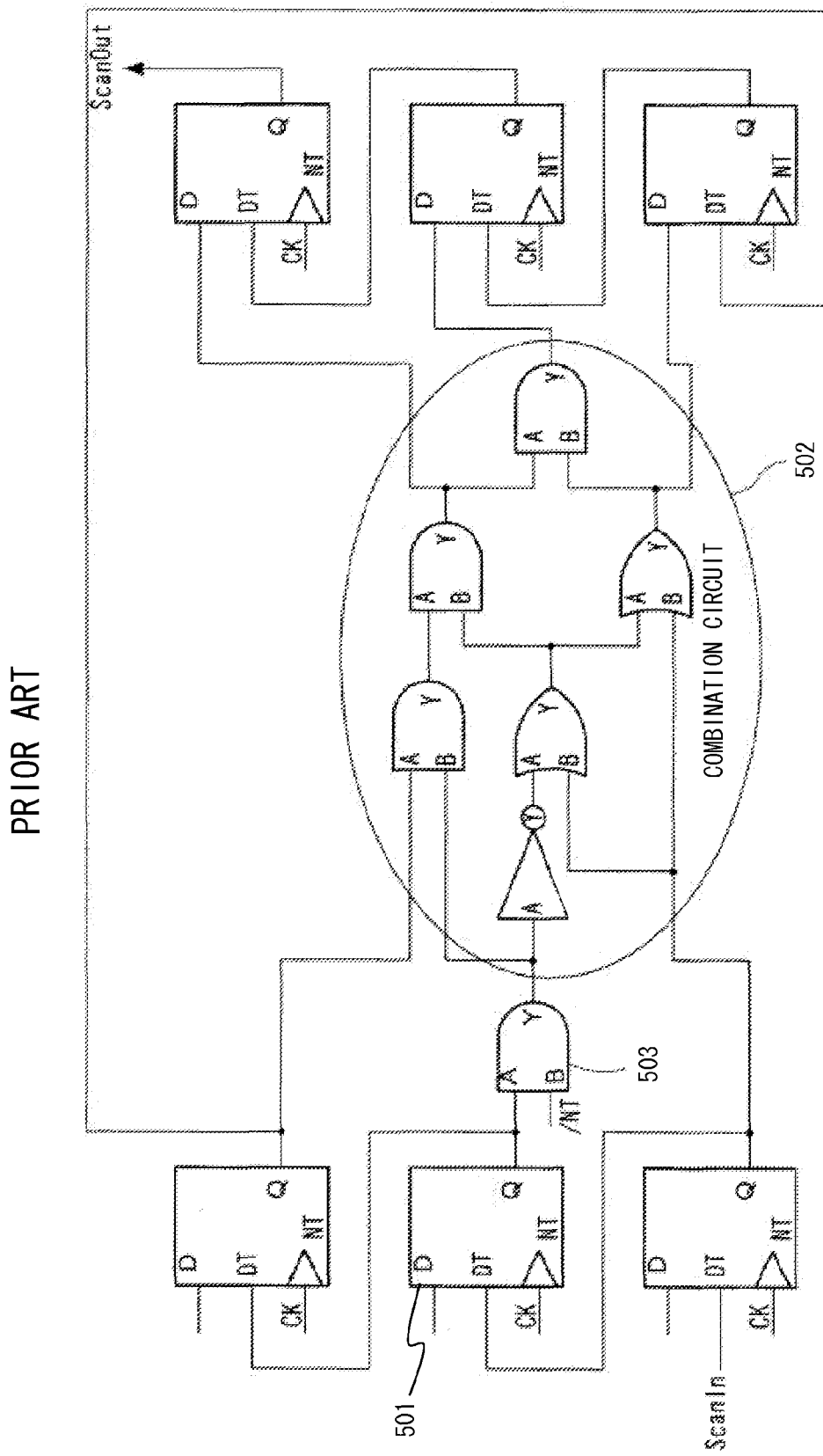
FIG. 10 is a diagram showing a semiconductor integrated circuit according to a related art.

Further, the target RTL description may be replaced with the simple redundant circuit in the process of the logic synthesis (B in FIG. 9). In this case, by registering the simple redundant circuit in a library as one cell with other plurality of cells, target RTL description may be automatically replaced with the simple redundant circuit by a logic synthesis tool. As a matter of course, even when the simple redundant circuit is not registered in the library as one cell, it is possible to edit the target RTL description using the logic synthesis tool to rewrite it into the configuration of the simple redundant circuit.

Further, the normal flip-flop may be replaced with the simple redundant circuit after the logic synthesis process (C shown in FIG. 9). Note that the replacement with the simple redundant circuit is preferably performed before timing adjustment. Further, the scan flip-flop may be replaced with the simple redundant circuit according to the present invention after a test circuit is provided as in the related art.

Note that the scan flip-flop which is to be replaced with the simple redundant circuit is determined based on the number of combination circuits driven by each scan flip-flop, for example. For example, the scan flip-flop having larger number of combination circuits to be driven than other scan flip-flops among a plurality of scan flip-flops is the target to be replaced with the simple redundant circuit.

Further, the scan flip-flop which is to be replaced with the simple redundant circuit is determined based on peak power consumption of the combination circuit driven by each scan flip-flop, for example. For example, the scan flip-flop with larger peak power consumption of the combination circuit to be driven compared to those of other scan flip-flops among a plurality of scan flip-flops is the target to be replaced with the simple redundant circuit.

The related art uses a design method of simply adding and providing a gating circuit such as an AND circuit after a test circuit is provided. Thus, when the gating circuit is additionally provided between the flip-flops forming a critical path, this may cause timing violation. It is impossible to additionally provide the gating circuit between the flip-flops forming the critical path, resulting in the problem that it is impossible to reduce peak power consumption.

On the other hand, when a scan flip-flop is replaced with the simple redundant circuit before timing adjustment as in one example of the present invention, the timing is adjusted in the simple redundant circuit so as to satisfy the timing restrictions with other internal circuits. Accordingly, in the present invention, the possibility in which the speed of the normal operation is reduced becomes low compared to the case of the related art.

If the related technical method is applied to the RTL design stage, it is required to perform design in consideration of a control signal which is not originally required to be considered in the RTL design stage. More specifically, it is general that information of the control signal (NT) is not described in the RTL description corresponding to the flip-flop in the RTL design stage. In short, in the RTL design stage, it is general that there is no need to consider the control signal (NT). However, when the gating circuit 503 is added in the RTL design stage, the design needs to be performed in consideration of the fact that the control signal (/NT) is supplied to the input terminal of the gating circuit 503. Meanwhile, since the present invention does not require a control signal, such a problem does not occur.

The first, second, and third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. An output control circuit comprising:
a first scan flip-flop that captures first data in a first mode and second data in a second mode in synchronization with a clock signal to output the data that is captured, the second data being supplied through a signal path different from a signal path of the first data;
a second scan flip-flop that captures the data output from the first scan flip-flop in the second mode in synchronization with a clock signal to output the data that is captured; and
a gating circuit that generates the data output from the first scan flip-flop in the first mode as output data, and generates output data having a flip rate of a logic value lower than a flip rate of a logic value of the data output from the first scan flip-flop based on the data output from each of the first scan flip-flop and the second scan flip-flop in the second mode.

2. The output control circuit according to claim 1, wherein the second scan flip-flop captures the first data that is common to the first scan flip-flop in synchronization with a clock signal in the first mode to output the first data, and the gating circuit comprises a logical AND circuit.

3. The output control circuit according to claim 1, wherein the second scan flip-flop captures the first data that is common to the first scan flip-flop in synchronization with a clock signal in the first mode to output the first data, and the gating circuit comprises a logical OR circuit.

4. The output control circuit according to claim 1, wherein the first scan flip-flop captures the data output from the second scan flip-flop in synchronization with a clock signal in place of the second data in the second mode to output the data that is captured, and the second scan flip-flop captures the second data in synchronization with a clock signal in place of the data output from the first scan flip-flop in the second mode to output the second data.

5. The output control circuit according to claim 1, further comprising a third scan flip-flop that captures the data output from the second scan flip-flop in the second mode in synchronization with a clock signal to output the data that is captured,
wherein the gating circuit generates output data having a flip rate of a logic value lower than a flip rate of a logic value of the data output from the first scan flip-flop based on the data output from each of the first scan flip-flop to the third scan flip-flop in the second mode.

6. The output control circuit according to claim 5, wherein each of the second scan flip-flop and the third scan flip-flop captures the first data common to the first scan flip-flop in synchronization with a clock signal in the first mode to output the first data, and
the gating circuit comprises a logical AND circuit.

7. The output control circuit according to claim 5, wherein each of the second scan flip-flop and the third scan flip-flop captures the first data common to the first scan flip-flop in synchronization with a clock signal in the first mode to output the first data, and
the gating circuit comprises a logical OR circuit.

8. The output control circuit according to claim 5, wherein each of the second scan flip-flop and the third scan flip-flop captures the first data common to the first scan flip-flop in synchronization with a clock signal in the first mode to output the first data, and
the gating circuit comprises a majority circuit.

9. The output control circuit according to claim 5, wherein the first scan flip-flop captures the data output from the third scan flip-flop in synchronization with a clock signal in place of the second data in the second mode to output the data that is captured, and
the third scan flip-flop captures the second data in synchronization with a clock signal in place of the data output from the second scan flip-flop in the second mode to output the second data.

10. The output control circuit according to claim 5, wherein the first scan flip-flop captures the data output from the third scan flip-flop in synchronization with a clock signal in place of the second data in the second mode to output the data that is captured, and
the second scan flip-flop captures the second data in synchronization with a clock signal in place of the data output from the first scan flip-flop in the second mode to output the second data.

11. A semiconductor integrated circuit comprising:
a plurality of scan flip-flops;
the output control circuit according to claim 1 forming a scan chain with the plurality of scan flip-flops; and
a combination circuit group that performs logical operation on data output from each of the output control circuit and the plurality of scan flip-flops to output the operation result.

12. The semiconductor integrated circuit according to claim 11, wherein
the combination circuit group includes a plurality of combination circuits, and
the number of combination circuits driven by the output control circuit is larger than the number of combination circuits driven by each of the scan flip-flops.

13. The semiconductor integrated circuit according to claim 11, wherein
the combination circuit group includes a plurality of combination circuits, and
electric power consumed by the combination circuit driven by the output control circuit is larger than electric power consumed by the combination circuit driven by each of the scan flip-flops.

14. A design method for the semiconductor integrated circuit according to claim 11, comprising:
selecting a scan flip-flop from a plurality of scan flip-flops; and
replacing the scan flip-flop that is selected with the output control circuit.

15. A design method for the semiconductor integrated circuit according to claim 11, comprising:
selecting a scan flip-flop from a plurality of scan flip-flops; and
editing the scan flip-flop that is selected to rewrite the scan flip-flop that is selected to the output control circuit.

* * * * *